(12) United States Patent
Norman

(10) Patent No.: US 6,817,869 B1
(45) Date of Patent: Nov. 16, 2004

(54) CONNECTOR FOR TRANSPORTING SIGNALS BETWEEN CONTACT PADS ON TWO SURFACES

(76) Inventor: Richard S. Norman, 1877 Poissant Road., Sutton, Quebec (CA), J0E 2K0

( * ) Notice: Subject to any disclaimer, the term of this patent is extended or adjusted under 35 U.S.C. 154(b) by 1 day.

(21) Appl. No.: 10/330,232

(22) Filed: Dec. 30, 2002

Related U.S. Application Data

(60) Provisional application No. 60/343,243, filed on Dec. 31, 2001.

(51) Int. Cl.[7] .............................. H01R 12/00; H05K 1/00

(52) U.S. Cl. ........................................................ 439/65

(58) Field of Search ............................ 439/65, 289, 74, 439/66, 91

(56) References Cited

U.S. PATENT DOCUMENTS 5,788,516 A * 8/1998 Uggmark ...................... 439/86

* cited by examiner

Primary Examiner—Javaid H. Nasri

(57) ABSTRACT

The present invention provides a connector for transporting signals. The connector comprises a body made of a continuous body of material or alternatively of a plurality of superposed layers. The body includes a first terminal end, a second terminal end that is remote from the first terminal end and a three-dimensional arrangement of signal transmissive pathways within the body. The signal transmissive pathways are spaced apart from one another and extend side by side along a direction of propagation from the first terminal end to the second terminal end. The signal transmissive pathways are exposed at the first terminal end and at the second terminal end to allow external devices connected to the first terminal end and to the second terminal end to exchange signals via the signal transmissive pathways. The signal transmissive pathways are distributed in the body in multiple directions transverse to the direction of propagation.

21 Claims, 13 Drawing Sheets

CONNECTOR FOR TRANSPORTING SIGNALS BETWEEN CONTACT PADS ON TWO SURFACES

CROSS-REFERENCE TO RELATED APPLICATION

The above-referenced application is based on provisional patent application No. 60/343,243, filed on Dec. 31, 2001, having the same inventor.

FIELD OF THE INVENTION

The present invention relates to a connector for establishing connections, and transporting signals between two external devices having contact pads on two surfaces in a non-parallel relationship with respect to each other.

BACKGROUND OF THE INVENTION

In related art it has been suggested that during integrated circuit fabrication and manufacturing, functional modules (i.e. processing modules, memory modules, I/O modules, etc.) can be connected to substrates, such as silicon wafers, printed circuit boards and multi-chip modules in a vertical position. Thus, the contact pads on the functional modules are positioned in a non-parallel relationship with respect to contact pads located on the surface of the substrate.

A difficulty that has arisen with positioning functional modules on substrates relates to interconnecting the contact pads of the functional modules with the contact pads on the substrate. Specifically, the difficulty arises in connecting the contact pads of the functional modules that are disposed in a non-parallel relationship with the contact pads on the surface of t-he substrate.

A more general problem relates to connecting the contact pads of a functional module with the contact pads on the surface of a substrate when the contact pads on the functional module have a different inter-contact-pad spacing than the contact pads on the substrate. This applies to any two functional modules that are mismatched in their inter-contact-pad spacing.

Consequently, there is a need in the industry for an improved connector that overcomes at least in part some of the above deficiencies.

SUMMARY OF THE INVENTION

As embodied and broadly described herein, the present invention provides a connector for transporting signals. The connector comprises a continuous body of material that has a three-dimensional shape characterized by three reference axes, wherein the continuous body is continuous along each one of the reference axes. The continuous body includes a first terminal end and a second terminal end that define two, not necessarily flat, non-parallel surfaces. Optionally, the first terminal end and the second terminal end may also define respective parallel surfaces. The connector further includes a three-dimensional arrangement of signal transmissive pathways within the continuous body. The signal transmissive pathways are spaced from one another and extend along a direction of propagation of the connector from the first terminal end to the second terminal end. The signal transmissive pathways are exposed at the first terminal end and at the second terminal end to allow external devices that are connected at the first terminal end and at the second terminal end to exchange signals via the signal transmissive pathways. The signal transmissive pathways are distributed in the continuous body in multiple directions transverse to the direction of propagation.

In a specific example of implementation, the connector of the present invention is made of a continuous body of dielectric material that is formed by such processes as molding the body of continuous material around a plurality of signal transmissive pathways. The signal transmissive pathways can be electrically conductive pathways that are capable of transporting electrical signals between the first terminal end and the second terminal end. Alternatively, the signal transmissive pathways can be optical fibers for transmitting optical signals between the first terminal end and the second terminal end.

The term "continuous" as used herein refers to a single body of material that is uninterrupted and unbroken. In other words, the continuous body does not include any seams.

As further embodied and broadly described herein, the present invention provides a connector for transporting signals. The connector typically comprises a body having a plurality of superposed layers of material defining a three-dimensional shape. The body includes a first terminal end and a second terminal end remote from first terminal end that define two, not necessarily flat, non-parallel surfaces. Optionally, the first terminal end and the second terminal end may define respective parallel surfaces. The connector further comprises a three-dimensional arrangement of signal transmissive pathways within the body. The signal transmissive pathways are spaced from one another and extend along a direction of propagation from the first terminal end to the second terminal end. The signal transmissive pathways are exposed at the first terminal end and at the second terminal end to allow external devices connected at the first terminal end and at the second terminal end to exchange signals via the signal transmissive pathways. The signal transmissive pathways are distributed in the body of material in multiple directions transverse to the direction of propagation.

In a specific example of implementation, the connector of the present invention is made of a body of dielectric material and the signal transmissive pathways can be electrically conductive pathways that are capable of transporting electrical signals between the first terminal end and the second terminal end of the connector. Alternatively, the connector of the present invention is made of a body of material that is capable of receiving signal transmissive pathways that are made of optical fibers for transmitting optical signals between the first terminal end and the second terminal end of the connector.

In a specific example of implementation, the signal transmissive pathways extend in a substantially side by side relationship along the direction of propagation from the first terminal end to the second terminal end. In another specific example of implementation, the signal transmissive pathways do not extend in a continuous side by side relationship from the first terminal end to the second terminal end. Instead, the signal transmissive pathways extend in a side by side relationship for only a partial distance from the first terminal end to the second terminal end. As such, the connector may provide a re-mapping function such that the position of one or more signal transmissive pathways at the first terminal end in relation to other signal transmissive pathways within that terminal end have a different position in relation to the other signal transmissive pathways at the other terminal end. This is achieved by the position of the signal transmissive pathways within the distribution of signal transmissive pathways changing routing within the body of the connector in order to form a re-mapping layer.

In a specific example of implementation, the body is a single sheet of material that is formed into a roll having a plurality of coils that form superposed layers. In a second example of implementation the body is a single sheet of material that includes a plurality of folds that form the superposed layers and in another example of implementation the body is a plurality of individual superposed discrete layers.

An advantage of the connector of the present invention is that it is able to establish a connection between two surfaces that are positioned in a non-parallel arrangement with respect to each other. This connection is formed by cutting or fabricating the terminal ends of the connector into planes that mate with the respective surfaces to be connected, such as discrete functional modules and wafers.

Other aspects and features of the present invention will become apparent to those ordinarily skilled in the art upon review of the following description of specific embodiments of the invention in conjunction with the accompanying figures.

Figure 1:
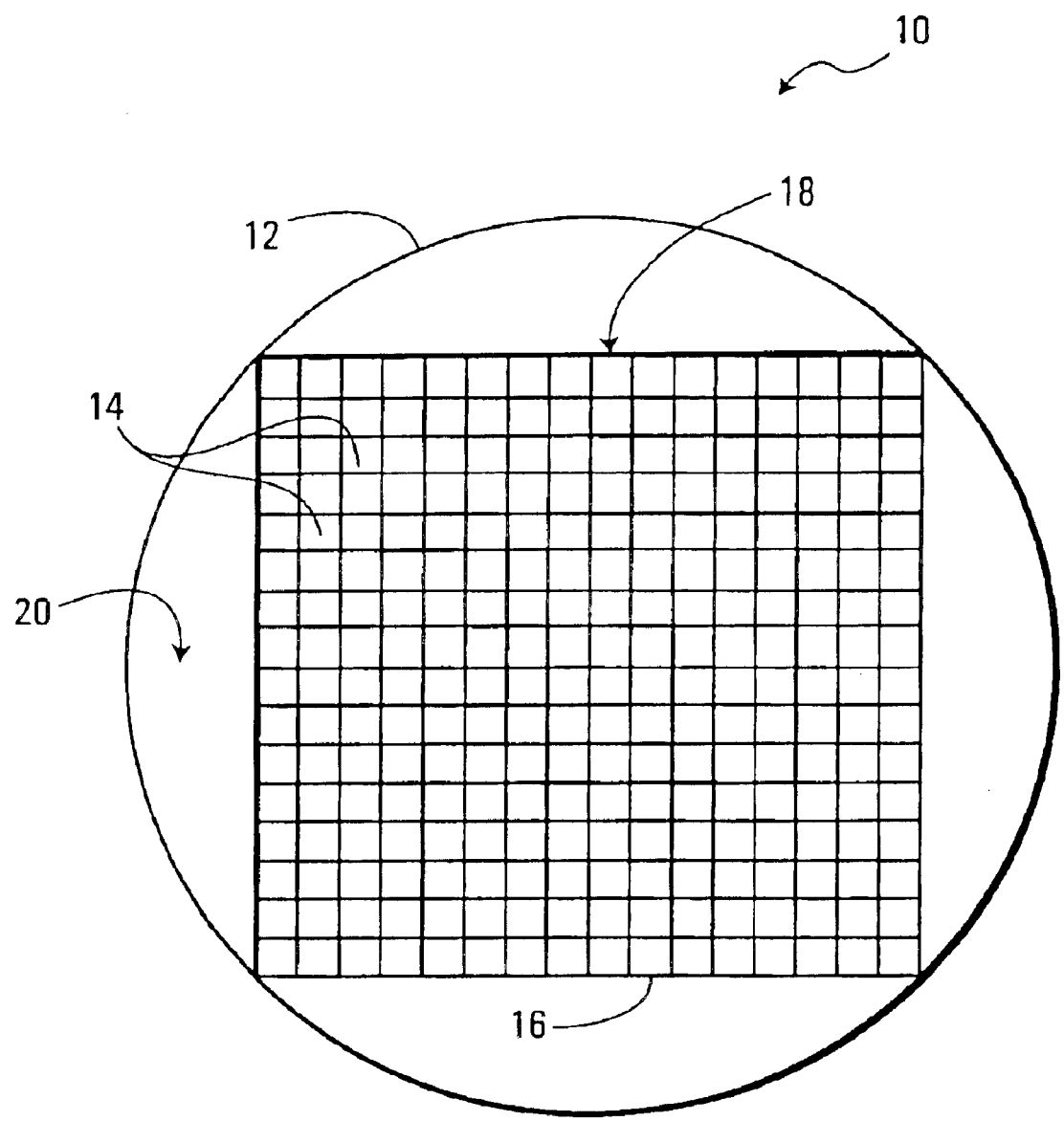
FIG. 1 is a top view of an example of a semiconductor, wafer.

In the drawings, embodiments of the invention are illustrated by way of example. It is to be expressly understood that the description and drawings are only for purposes of illustration and as an aid to understanding, and are not intended to be a definition of the limits of the invention.

DETAILED DESCRIPTION

FIG. 1 is a top view of a semiconductor wafer 10, in accordance with one example of a typical microelectronic complex. The wafer 10 is formed of a planar body of semiconductor material 12 and contains a plurality of discrete functional modules 14, also referred to as cells. In this particular example of a microelectronic complex, each discrete functional module 14 includes at least one integrated circuit.

Note that in other examples of microelectronic complexes, such as the integrated circuit itself, the discrete functional modules of the microelectronic complex include the electronic components of the integrated circuit. Further, although the following example of implementation describes a microelectronic complex formed on a semiconductor wafer, the present invention is generally applicable to all microelectronic complexes formed on planar bodies or substrates, or on bodies/substrates defining at least one planar surface, where these bodies/substrates may be of various types of materials.

The wafer body of semiconductor material 12 is made of any suitable material that has the requisite electrical properties and mechanical strength, such as silicon, germanium or gallium arsenide, and may be of any size or shape. In the example of FIG. 1, the semiconductor material of wafer body 12 is silicon, the body 12 characterized by a circular shape as a result of the cylindrical shape of the silicon crystal from which the wafer 10 was sliced. Typically, body 12 would be 10 to 30 cm in diameter and less than 1 mm thick.

The methods and techniques used to form integrated circuits in the material of body 12, such as oxidation, diffusion, ion implantation and chemical vapor deposition, have been well documented and are well known in the art. As such, these methods and techniques will not be described in further detail.

The cells 14 of the wafer 10 are dispersed within a dedicated area 16 of the body 12. Alternatively, the cells 14 may be dispersed across the entire surface area of body 12. In the example of FIG. 1, the cells 14 are laid out in a structured array 18, where the cells 14 are all adjacent one another and each cell 14 is of the same size and occupies substantially the same amount of space. Alternatively, the cells 14 could be spaced apart from each other within the array 18, and could be of different sizes and occupy different amounts of space.

The wafer 10 has first and second planar surfaces, where the first planar surface 20, also referred to as the main surface, is shown in FIG. 1. Although not shown in FIG. 1, a plurality of Input/Output (I/O) signal conducting members are mounted on the first surface 20 for connection to an external substrate, such as a circuit board. Examples of signal conducting members include connectors, pins and wires, among other possibilities. These signal conducting members are characterized by a high level of conductivity for transmitting signals between the discrete functional modules 14 of the wafer 10 and the external substrate, where such signals may include electrical and/or optical signals.

In a specific example of implementation, the wafer 10 is constructed using flip-chip technology, and solder balls or bumps are formed on the surface 20 of wafer 10, for receiving the I/O signal conducting members. The concept of flip-chip technology is well known to those skilled in the art, has been well documented and, as such, will not be described in further detail. Alternatively, the signal conducting members may be mounted to the second surface (not shown in FIG. 1) of the wafer 10.

Figure 2:
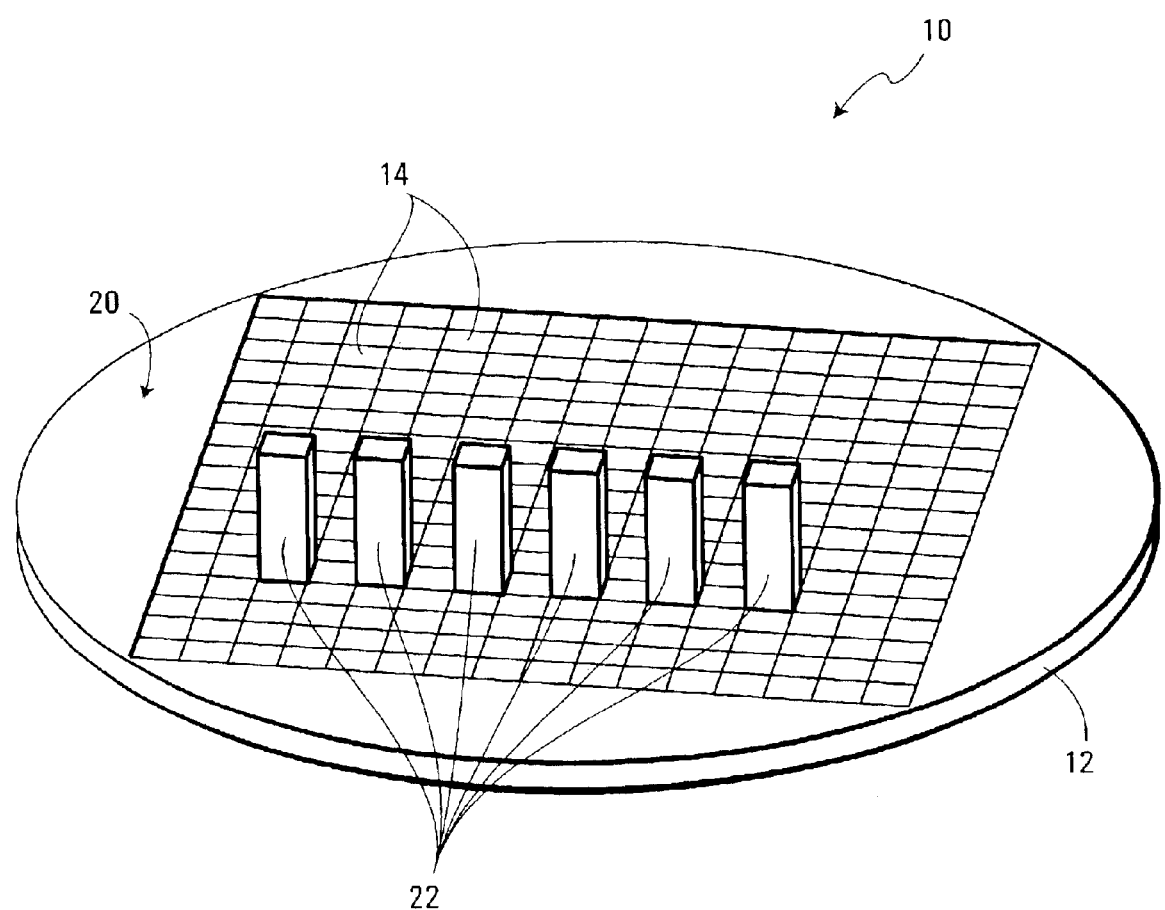
FIG. 2 is a perspective view of a semiconductor wafer including a plurality of discrete processing modules.

Specific to the present invention, the planar main surface 20 of the wafer 10 includes attachment sites (not shown) for receiving multiple discrete functional modules 22. Each functional module 22 is affixed to the body 12 at a designated attachment site, as shown in the perspective view of FIG. 2. The functional modules 22 are maintained in a predetermined spatial relationship with the body 12 of the wafer 10, as will be discussed in further detail below. In the example of FIG. 2, the functional modules 22 are arranged side by side in a row on the main surface 20 of the wafer 10, and share a common finger-like shape.

Note that the wafer 10 may include any number of functional modules 22, including only one, and that these functional modules 22 may be arranged in various orderly arrangements, or alternatively may be randomly dispersed, on the surface 20 of the wafer 10. Further, the functional modules 22 may be characterized by various shapes and sizes.

Each functional module 22 is designed to perform a particular function or to implement a particular process within the microelectronic complex of wafer 10. In a specific example, a functional module 22 receives/transmits optical signals from/to an external entity. Accordingly, the functional module 22 would include an optical transceiver for coupling to a plurality of optical fibers connecting the functional module 22 to the external entity, as well as an application-specific integrated circuit (ASIC) for processing, and possibly generating, the optical signals. In another specific example, a functional module 22 includes one or more processors, as well as standard functional sub-modules, such as SRAM and DRAM, for performing standard processing operations within the microelectronic complex.

Note that in a high-density architecture such as that shown in FIG. 2, the microelectronic complex should include high-performance data buses formed on the wafer 10. These data buses serve to interconnect the discrete functional modules 22 and the cells 14 of the wafer 10, and allow the transfer of data between connected modules 22 and cells 14.

Figure 3:
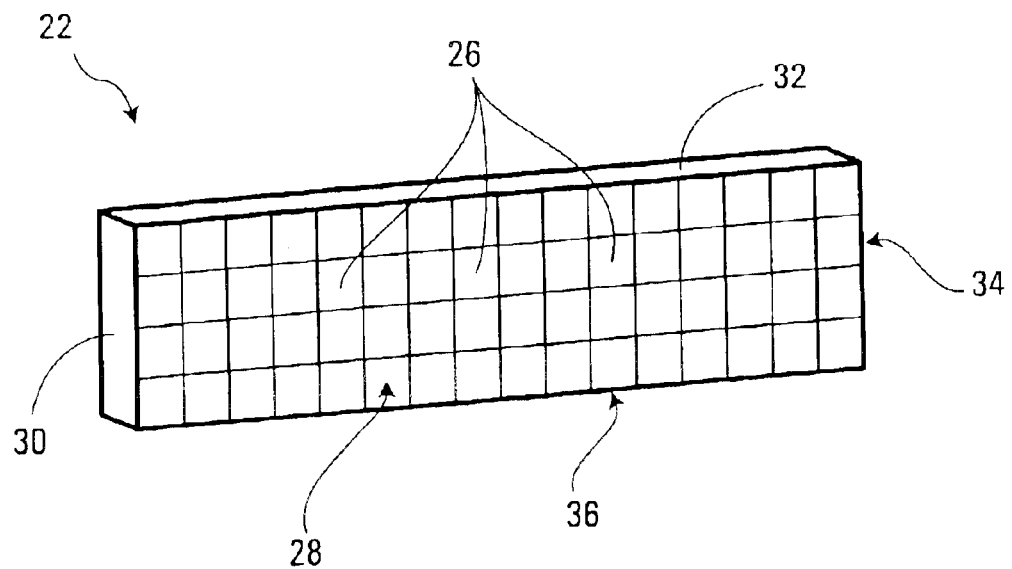
FIG. 3 is a front perspective view of a discrete processing module shown in FIG. 2.
Figure 4:
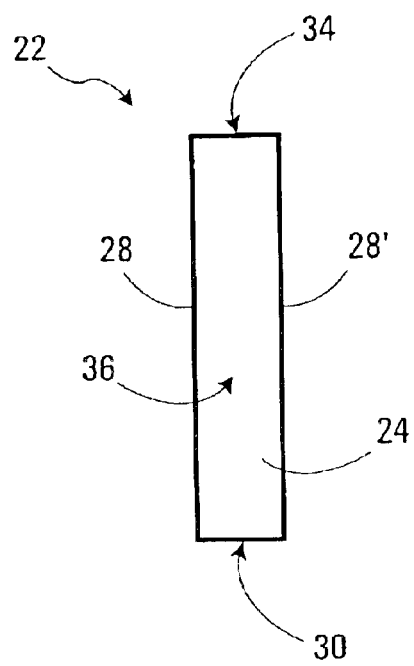
FIG. 4 is a side view of the discrete processing module shown in FIG. 3.

As seen in FIGS. 3 and 4, a functional module 22 is formed of a body 24 of heat-conductive material, which includes a pair of main faces 28 and 28', as well as four side surfaces 30, 32, 34 and 36 located between the main faces 28, 28'.

The functional modules 22 are affixed to the body 12 of wafer 10 at the designated attachment site such that, for each functional module 22, the side surface 30 of the body 24 faces the main surface 20 of body 12. In the example of FIG. 2, the side surface 30 of each functional module 22 is in contact with the main surface 20 of body 12 at an attachment site. Alternatively, the functional modules 22 may be spaced apart from the main surface 20 of the body 12, such that the side surfaces 30 of the functional modules 22 face, but are not in direct contact with, the surface 20 of body 12.

Note that, in a specific example, the functional modules 22 may be affixed to the body 12 of wafer 10 such that, for each functional module 22, any one of the other three side surfaces 32, 34 and 36 of body 24 faces the main surface 20 of body 12.

The body 24 of each functional module 22 contains a plurality of discrete functional sub-modules 26, each discrete functional sub-module 26 including at least one integrated circuit. Alternatively, the functional module 22 May contain a single discrete functional sub-module 26, formed of one or more integrated circuits.

In a specific example, the body 24 of each functional module 22 is a substrate onto which are mounted a plurality of semi-conductor chips, each chip including at least one integrated circuit. The substrate 24 is formed of any suitable dielectric, heat-conductive material.

In another specific example, the body 24 of each functional module 22 is formed of semi-conductor material, such as silicon, and contains one or more integrated circuits. Note that integrated circuits may be formed in the semiconductor material of body 24 using the same methods and techniques as those used on the body 12 of wafer 10.

The side surface 30 of a functional module 22, and thus its footprint on the surface 20 of body 12, is characterized by a very small surface area, in order to compensate for any potential difference in thermal expansion between the material of the functional module 22 and the material of the wafer 10. Thermal expansion effects, which are well known in the art and as such will not be discussed in further detail, may damage the connection(s) between the functional module 22 and the wafer 10.

Thus, the surface area over which the functional module 22 and the wafer 10 are connected should be small enough to ensure that, under normal operating conditions, any thermal expansion effects arising within that surface area will typically be insufficient to cause any breakage between the functional module 22 and the wafer 10. In a specific example of implementation, the surface area of side surface 30 is no greater than 900 mm2, which is comparable to the surface area of a chip manufactured using today's standard chip packaging technology.

Figure 5:
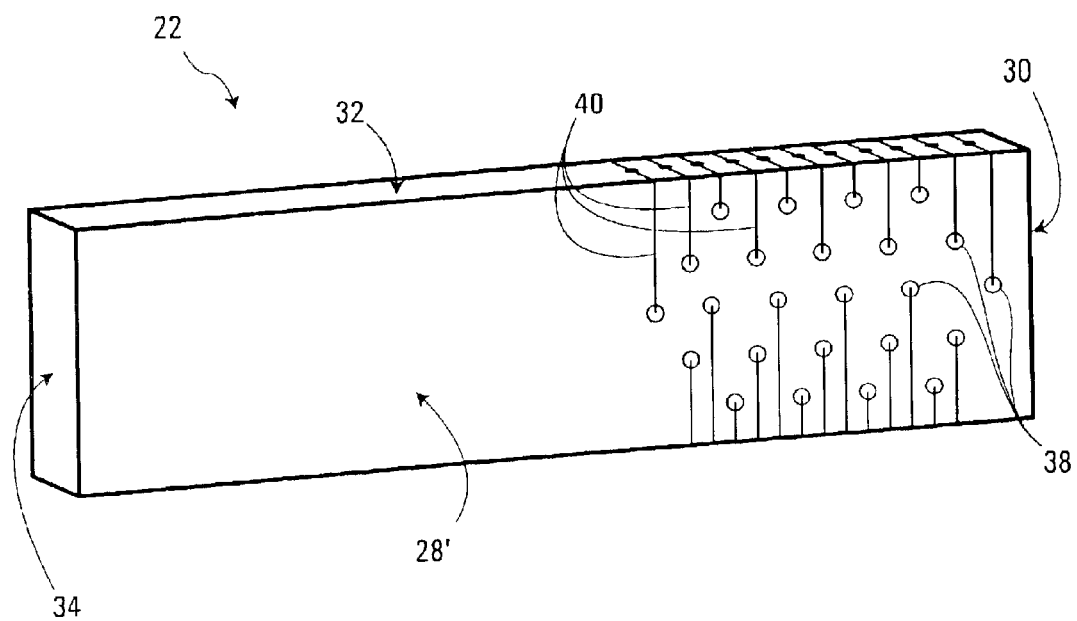
FIG. 5 is a rear perspective view of the discrete processing module shown in FIG. 3.

As seen in FIG. 5, on the main face 28' of the body 24 of each functional module 22 are mounted a plurality of contact pads 38. These contact pads 38 are adapted to receive signal-conducting members (not shown) for connection to the body 12 of wafer 10. Each contact pad 38 is associated with a discrete functional sub-module 26 of the respective functional module 22, where several contact pads 38 may be associated with different components of the same functional sub-module 26. Fine wires 40 are mounted to additional pads mounted around the perimeter of the body 24. These tiny wires 40 are bonded to the contact pads 38 on the main face 28', and interconnect the points of connection of functional sub-modules 26 on the main face 28 to the contact pads 38.

Alternatively, the body 24 may be constructed using a technology similar to wafer flip-chip technology, in which case the contact pads 38 are solder balls or bumps positioned on the main face 28 of the body 24. In this case, fine wires 40 would not be required to wrap around the body 24, from main face 28 to main face 28'. The concept of flip-chip technology is well known to those skilled in the art, has been well documented and, as such, will not be described in further detail.

Thus, the contact pads 38 located on one of the main faces 28, 28' of a particular functional module 22 allow signals to be exchanged between the particular functional module 22 and the discrete functional modules 14 of the body 12, via the signal conducting members.

In order to attach or affix a functional module 22 to the wafer 10, more specifically the side surface 30 of body 24 of functional module 22 to the main surface 18 of body 12 of wafer 10, several different techniques may be used. In a specific example, the functional modules 22 are surface mounted to the body 12 using standard solder or thermoset (thermally conductive adhesive or gel) anchoring techniques. Alternatively, the functional modules 22 may be attached using one or more mechanical attachment devices, such as a clamp, adhesive or screws. In another alternative, each functional module 22 is received in, and frictionally engaged by, a corresponding receptacle formed in the body 12 of wafer 10.

The affixing of functional modules 22 to the body 12 of wafer 10 ensures that these functional modules 22 are maintained in a spatial relationship with the wafer 10. Specific to the non-limiting example of implementation shown in FIG. 2, the finger-like functional modules 22 are mounted or the body 12 of wafer 10 such that they are substantially perpendicular to the planar surface 20 of body 12. As shown in the side view of FIG. 7, the main faces 28, 28' of each functional module 22 form a right angle with the surface 20 of body 12.

In a specific example, for each functional module 22 affixed to wafer 10, there is provided an interconnection module 44 containing a plurality of signal conducting members for conveying signals between the contact pads 38 on main face 28' of the functional module 22 and the body 12 of wafer 10. The body of this interconnection module 44 is formed of any suitable dielectric material, such as plastic.

Figure 6:
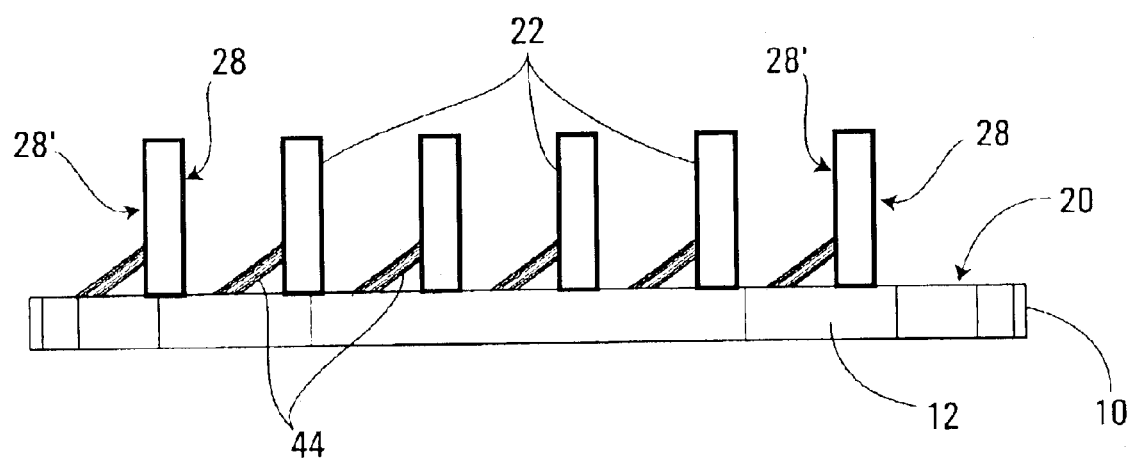
FIG. 6 is a side view of the semiconductor wafer shown in FIG. 2.
Figure 7:
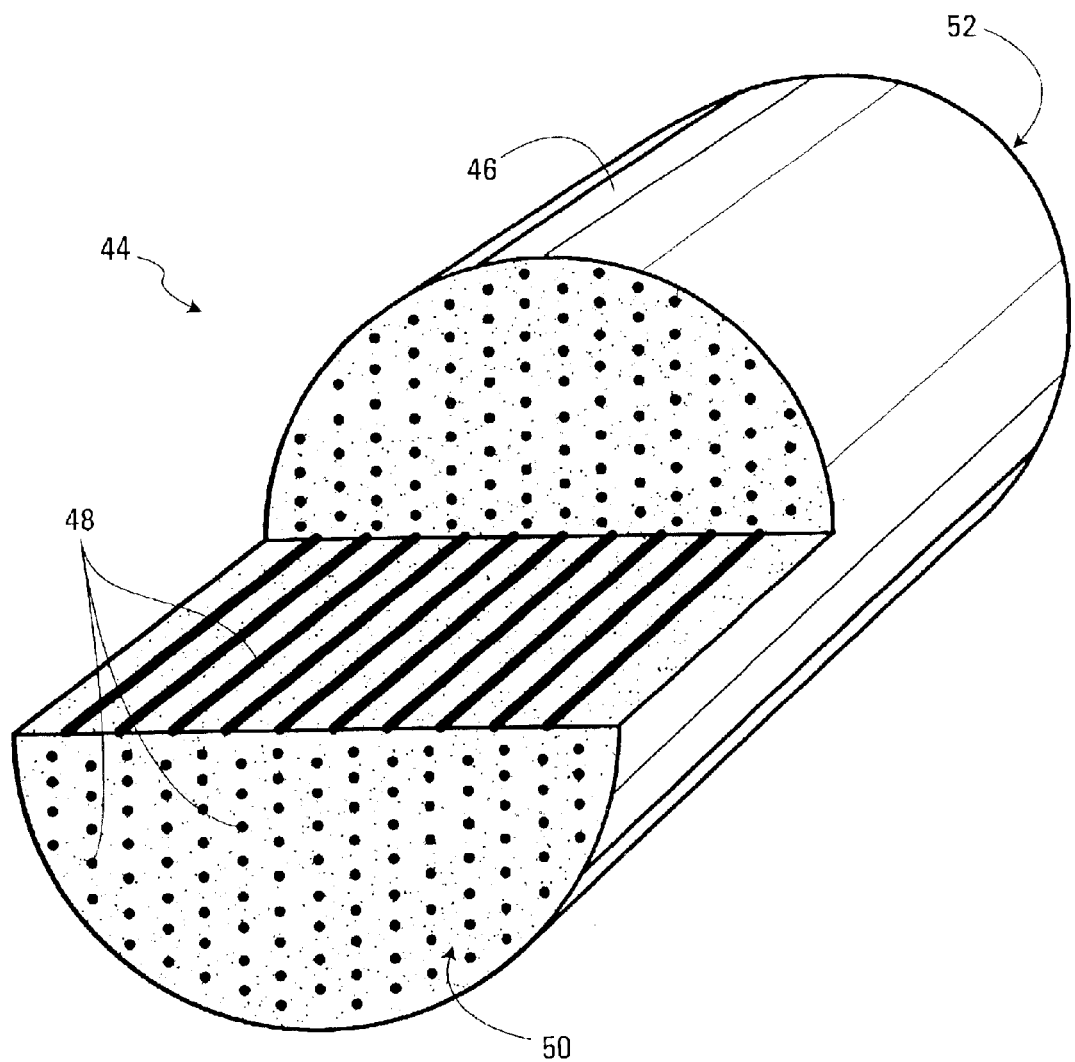
FIG. 7 is a perspective view of a connector according to a first embodiment of the present invention shown with an offset cut.

FIGS. 6 and 7 show a connector 44 according to a first embodiment of the present invention. Connector 44 comprises a continuous body 46, a first terminal end 50, a second terminal end 52 and an arrangement of signal transmissive pathways 48 densely packed within body 46. In the embodiment shown, connector 44 is in the general shape of a cylinder, however, it should be expressly understood that it is within the scope of the invention for connector 44 to be of any shape or size. As a specific example, continuous body 46 may be formed by molding a continuous material around a plurality of signal transmissive pathways.

Continuous body 46 is characterized by three reference axes wherein a first reference axis extends from the first terminal end 50 to the second terminal end 52 and is generally in the direction according to which the connector 44 longitudinally extends. Accordingly, the first reference axis is the longitudinal axis of the body 46. It should be expressly noted that the reference axis system may be located differently with relation to the body 46 without departing from the invention. In the embodiment shown, the densely packed signal transmissive pathways 48 have a direction of propagation from the first terminal end 50 to the second terminal end 52 that is generally along the longitudinal axis of the body 46. However, it should be understood that it is not essential for the signal transmissive pathways 48 to extend in this direction.

Continuous body 46 is continuous along all three of its axes. By continuous it is meant that continuous body 46 is unbroken and uninterrupted. In other words, continuous body 46 does not include any seams.

As mentioned above, signal transmissive pathways 48 extend along a direction of propagation from the first terminal end 50 to the second terminal end 52. When a cross-section of the body 46 is taken in a plane normal to the direction of propagation of the signal transmissive pathways 48, the signal transmissive pathways 48 are distributed in this plane in several different directions. The particular pattern of distribution is not critical so long as the signal transmissive pathways 48 are spaced apart and are distributed in different directions in the plane. A pattern of distribution that does riot fall under this definition is a situation where the signal transmissive pathways are all lined up in one direction only.

Signal transmissive pathways 48 are exposed at both first terminal end 50 and second terminal end 52. In this manner, when external devices, such as a functional module 22 and a wafer 10 are connected to the terminal ends 50 and 52 of connector 44, the contact pads of the external devices are able to mate with the exposed signal transmissive pathways 48, and exchange signals with each other through the signal transmissive pathways 48. It is possible that continuous body 46 is made of a flexible material that is able to expand and contract so that the distance separating respective signal transmissive pathways 48 within continuous body 46 is also able to expand and contract. This is especially desirable if the two external devices to be connected by the connector 44 have different thermal coefficients of expansion.

Under a first possibility, signal transmissive pathways 48 are metallic electrically conductive pathways for transporting electrical signals between first terminal end 50 and second terminal end 52. Under this first possibility, continuous body 46 is made of dielectric material. Under a second possibility, signal transmissive pathways 48 include optical fibers that are capable of transporting optical signals. Under this second possibility, continuous body 46 does not need to be made of dielectric material, and instead can be made of any material that is appropriate for supporting and maintaining the signal conductive pathways in a predetermined spatial relationship.

Figure 8:
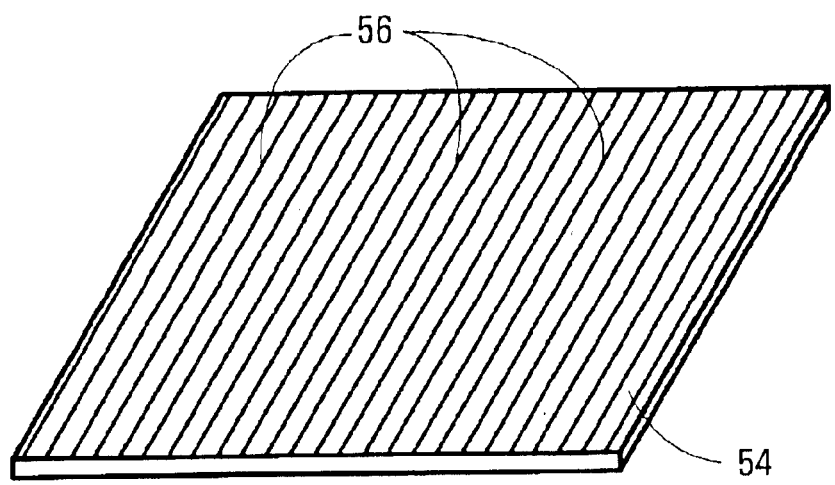
FIG. 8 is a perspective view of a sheet of material comprising a series of signal transmissive pathways.

With reference to FIG. 8, a continuous sheet of material 54 is shown that includes a plurality of densely packed signal transmissive pathways 56 formed in a side-by-side relationship on the surface of the sheet of material 54. It is within the scope of the present invention that signal transmissive pathways 56 are not positioned in a continuous side by side arrangement on the surface of the sheet of material 54. It is possible that the signal transmissive pathways form a re-mapping layer and are only in a continuous side by side arrangement for a partial distance on the surface of sheet of material 54.

It is possible that the sheet of material 54 is made of a flexible material that is able to expand and contract such that the distance separating respective signal transmissive pathways 56 is also able to expand and contract. Under a first possibility, the signal transmissive pathways 56 are metallic electrically conductive pathways for transporting electrical signals. In one example of implementation, sheet of material 54 may be a flexible printed circuit made of an electrically insulating material such as Kapton® onto which are formed, by known printing techniques, a series of copper signal transmission pathways 56. Under a second possibility, signal transmissive pathways 56 include optical pathways, such as optical fibers for carrying optical signals, the optical pathways can be integrated into the flexible material using known techniques. Under this second possibility, sheet of material 54 does not need to be made of an electrically insulating material, and can instead be made of any material that is appropriate for supporting and maintaining the optical signal conductive pathways in a predetermined spatial relationship.

Figure 9A:
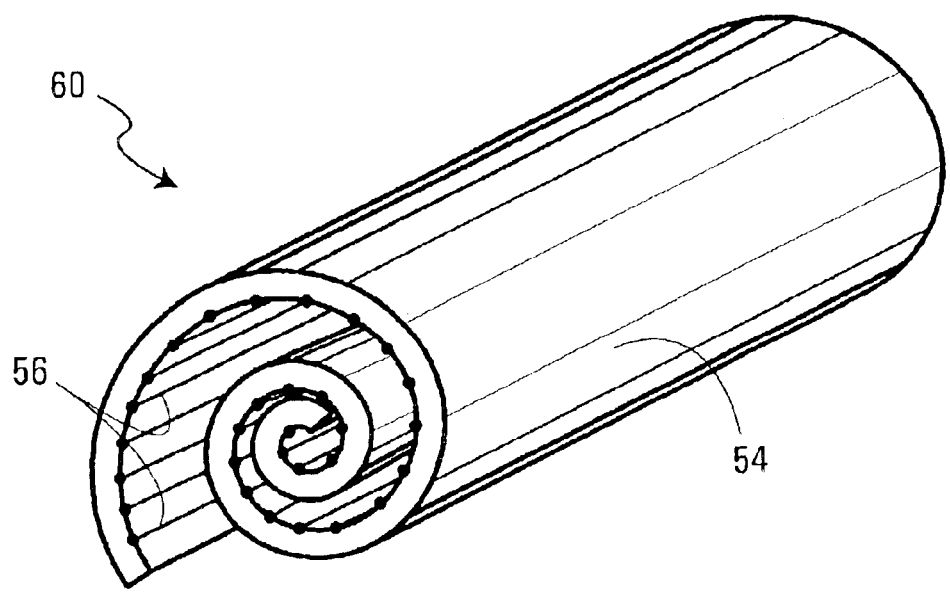
FIG. 9A is a perspective view of a connector according to a second embodiment of the present invention in a partial state of completion.
Figure 9B:
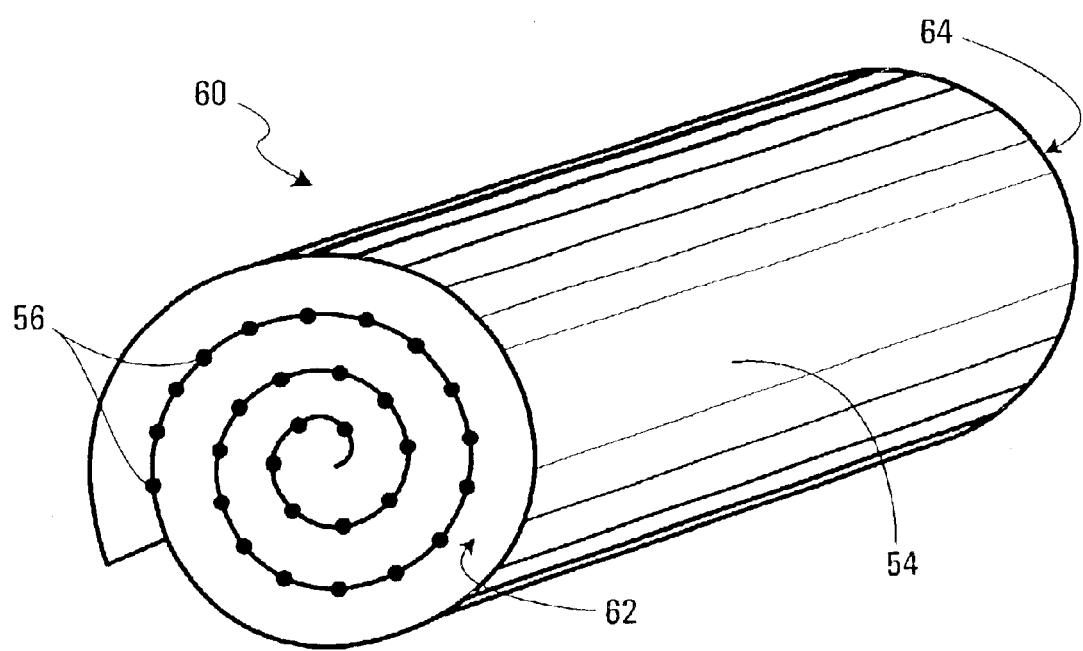
FIG. 9B is a perspective view of the connector shown in FIG. 9A, fully completed.

Shown in FIGS. 9A and 9B is a connector 60 according to a second embodiment of the present invention. Connector 60 is formed by rolling the continuous sheet of material 54, including the signal transmissive pathways 56, into a cylinder that has a plurality of coils forming a series of superposed layers. FIG. 9A shows connector 60 in a state of partial completion, and FIG. 9B shows connector 60 in the fully completed state once sheet of material 54 has been tightly formed into a cylinder. As can be seen in FIG. 9B, connector 60 comprises a first terminal end 62 and a second terminal end 64.

Figure 10A:
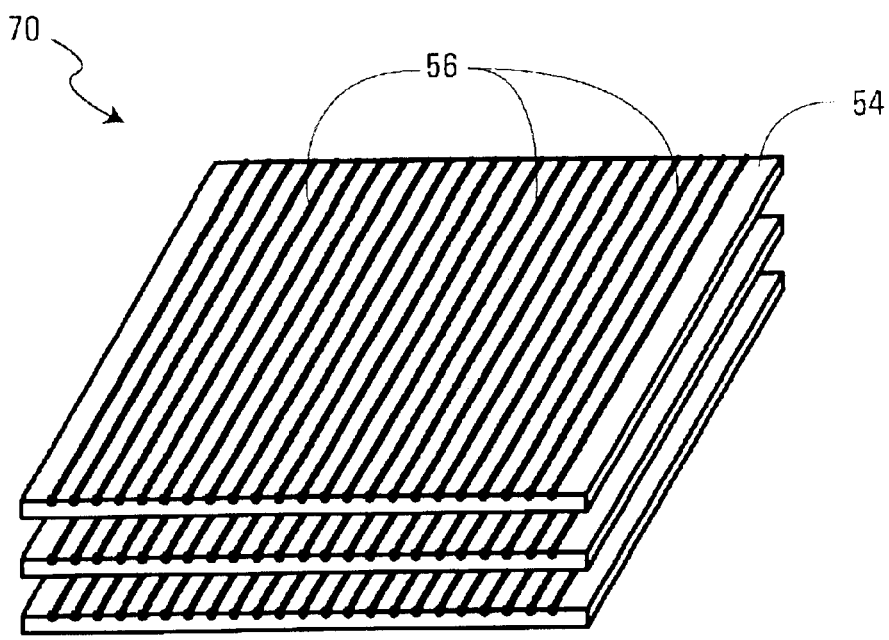
FIG. 10A is a perspective view of a connector according to a third embodiment of the present invention in a partial state of completion.
Figure 10B:
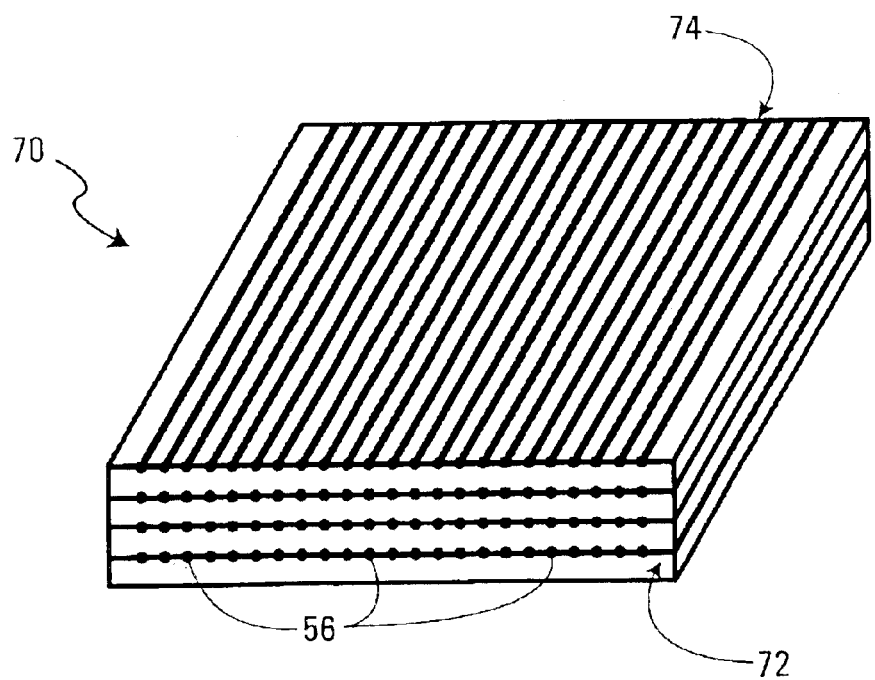
FIG. 10B is a perspective view of the connector shown in FIG. 10A, fully completed.

Shown in FIGS. 10A and 10B is a connector 70 according to a third embodiment of the present invention. Connector 70 is formed by stacking a plurality of sheets of material 54 on top of each other such that the signal transmissive pathways 56 formed on the surface of the sheet of material 54 are sandwiched between the layers of material 54. FIG. 10A shows connector 70 in a partial state of completion and FIG. 10B shows connector 70 in a fully completed state once the plurality of sheets of material 54 have been tightly formed into a three-dimensional stack. As can be seen in FIG. 10B, connector 70 includes a first terminal end 72 and a second terminal end 74.

Figure 11A:
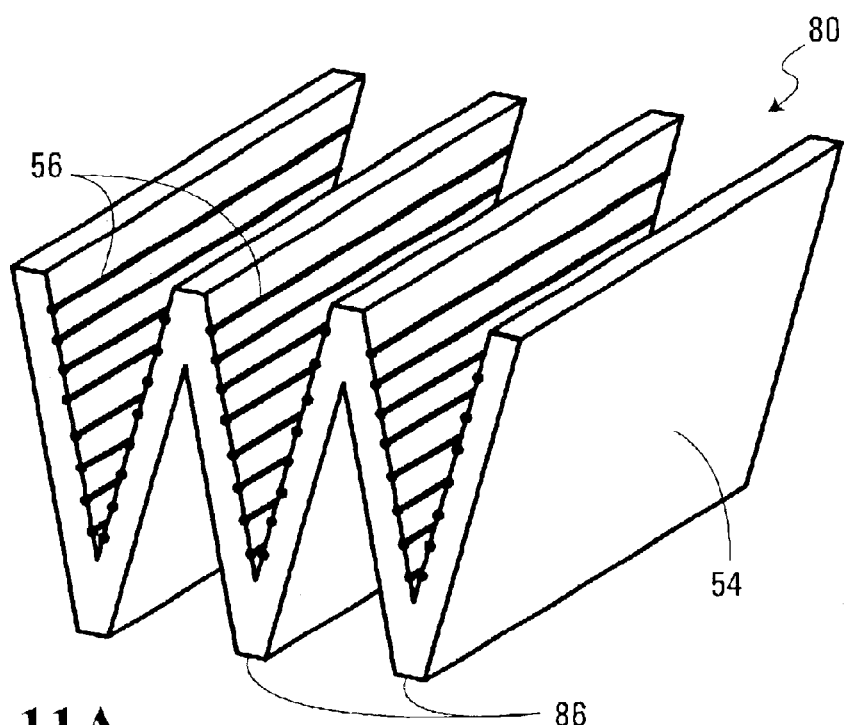
FIG. 11A is a perspective view of a connector according to a fourth embodiment of the present invention in a partial state of completion.
Figure 11B:
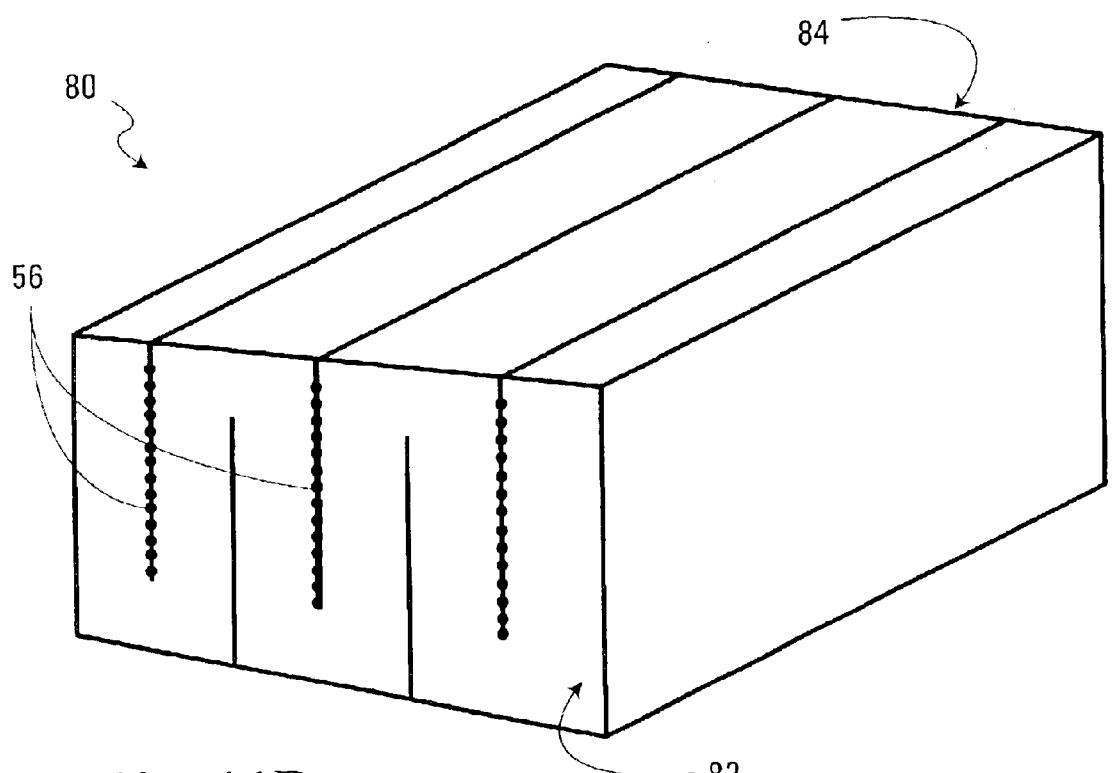
FIG. 11B is a perspective view of the connector shown in FIG. 11A, fully completed.

Shown in FIGS. 11A and 11B is a connector 80 according to a fourth embodiment of the present invention. Connector 80 is formed by folding continuous sheet of material 54, including the signal transmissive pathways 56, into an accordion-like structure having a plurality of layers connected to one another along their edges 86. FIG. 11A shows connector 80 in a partial state of completion and FIG. 11B shows connector 80 in a fully completed state once the accordion-like layers have been tightly formed into a three-dimensional block. As can be seen in FIG. 11B connector 80 has a first terminal end 82 and a second terminal end 84.

As can be seen in FIGS. 9A through 11B, connectors 60, 70 and 80 comprise superposed layers. These superposed layers can be maintained together by using adhesive or by slightly heating the sheet of material 54 such that the layers of material thermally bond together. Any other bonding technique known in the art can also be used to connect the plurality of layers of connectors 60, 70 and 80 together.

All of connectors 60, 70 and 80 Include signal transmissive pathways 56 that extend in a direction of propagation from the first terminal end of the connector to the second terminal end of the connector. As can be seen in FIG. 9B, 10B and 11B, signal transmissive pathways 56 are distributed in multiple directions in a plane transverse to the direction of propagation of the signal transmissive pathways. In connector 60 according to the second embodiment of the invention, the distribution of signal transmissive pathways 56 is formed into a spiral. In connectors 70 and 80, according the third and fourth embodiments of the invention, the distribution of signal transmissive pathways is formed into a grid-like pattern. In all of connectors 60, 70, and 80, signal transmissive pathways 56 are exposed at both the first terminal end and the second terminal end of the respective connectors.

In use, when external devices, such as functional modules 22 and wafers 10, are connected to the terminal ends of connectors 44, 60, 70 and 80 according to the four embodiments disclosed above, the contact pads on the surfaces of the external devices are able to mate with the signal transmissive pathways that are exposed at the terminal ends of the connectors. The external devices are thus able to exchange signals with each other through the signal transmissive pathways 56.

Connectors 44, 60, 70 and 80 as described above all contain a high concentration of signal transmissive pathways (either 48 or 56). It is advantageous to have a high concentration of relatively small signal transmissive pathways within a connector when the external devices to be connected have different thermal coefficients of expansion. The high concentration of signal transmissive pathways are able to minimize the connection area of the signal transmissive pathways to the contact pads of the external devices and are hence able to minimize the effects of thermal coefficient expansion mismatch between the two external devices.

Figure 12:
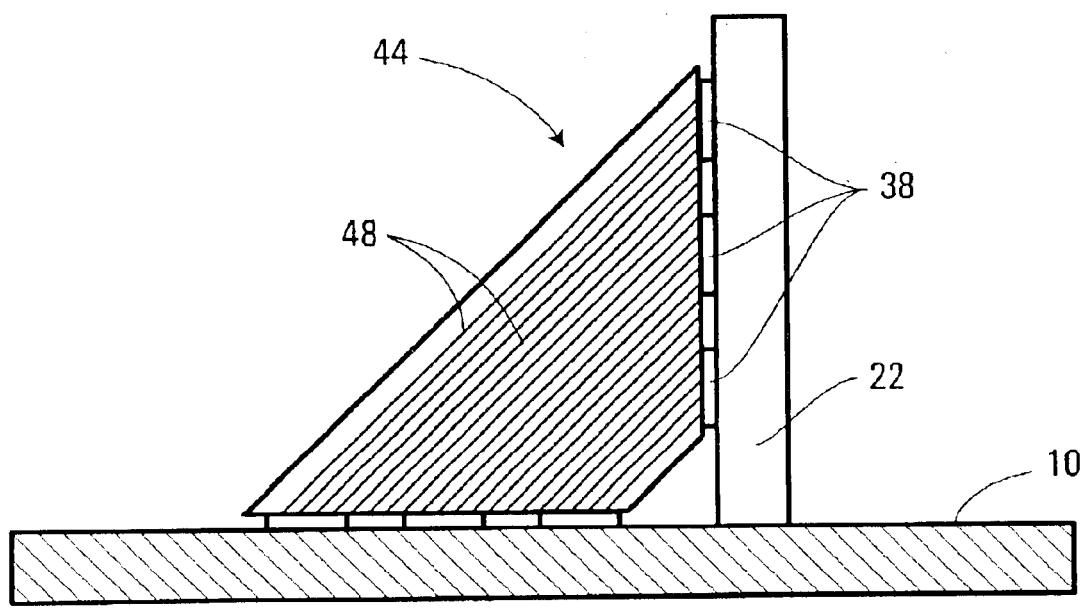
FIG. 12 is a side cross-sectional view of the connector shown in FIG. 7 connecting between two external devices.

In a preferred embodiment, the signal transmissive pathways 43 within connector 44, and the signal transmissive pathways 56 within connectors 60, 70 and 80, are smaller than the contact pads of the external devices to which the connectors are intended to mate. Therefore, more than one signal transmissive pathway is able to connect to each individual contact pad on an external device to be connected. In FIG. 12 is shown the connector 44 according to the first embodiment of the invention, connected between wafer 10 and a functional module 22. For clarity, contact pads 38 on functional module 22 and the contact pads (not numbered) on wafer 10 have been drawn so that they extend outwardly from their respective surfaces. In reality, the contact pads would probably be flush with their respective surfaces. As can be seen in FIG. 12, more than one signal transmissive pathway 48 is connected to each individual contact pad 38 on functional module 22 and to each contact pad on wafer 10. This eliminates the need for careful and precise alignment of connector 44 since there is no need to carefully align one signal transmissive pathway with one individual contact pad. It should be expressly understood however that in a special case it is possible that only one signal transmissive pathway 48 mates with one individual contact pad on an external devise, Although connector 44 is shown in FIG. 12, any one of the connectors according to the embodiments of the invention disclosed above could have been used.

For any one of the connectors of the four embodiments disclosed above, a distance "d" can be measured between any two signal transmissive pathways in a plane normal to the direction of propagation of the signal transmissive pathways, and that distance "d" will remain constant from the connector's first terminal end to the connector's second terminal end. It should be expressly understood that the distance "d" is not necessarily the same between all signal transmissive pathways. In fact, it is entirely possible that the distance separating two signal transmissive pathways is different for every combination of two signal transmissive pathways.

The connectors according to all four of the above-described embodiments of the present invention can have a first terminal end and a second terminal end that define two parallel surfaces, so as to connect to contact pads that are positioned on two parallel surfaces. Alternatively, it is within the scope of the invention for the first terminal end and the second terminal end to define two non-parallel surfaces. The two non-parallel surfaces are formed by cutting or fabrication the connector such that at least one of its terminal ends is formed into a plane that is not normal to the direction of propagation of the signal transmissive pathways. It should also be understood that it is not essential for the surfaces of the terminal ends to be formed into planes and that any type of surface is within the scope of the present invention.

When the terminal ends of a connector are cut or formed into two non parallel surfaces the distance "c" between two signal transmissive pathways measured at the first terminal end may be different from the distance "c" between the same two signal transmissive pathways at the second terminal end.

The signal transmissive pathways (either 48 or 56) within any one of connectors 44, 60, 70 and 80 may extend in a continuous side by side relationship from the first terminal end of the connector to the second terminal end of the connector, or alternatively, the signal transmissive pathways may extend in a side by side relationship for only a partial distance from the first terminal end of the connector to the second terminal end of the connector. As such, the connector may provide a re-mapping function wherein the position of one or more signal transmissive pathways at the first terminal end in relation to other signal transmissive pathways at that first terminal end is different from the position of the same one or more signal transmissive pathways in relation to the other signal transmissive pathways at the second terminal end. This is achieved by the position of the signal transmissive pathways within the distribution of signal transmissive pathways changing their routing within the body of the connector, thereby forming a re-mapping layer.

Figure 13A:
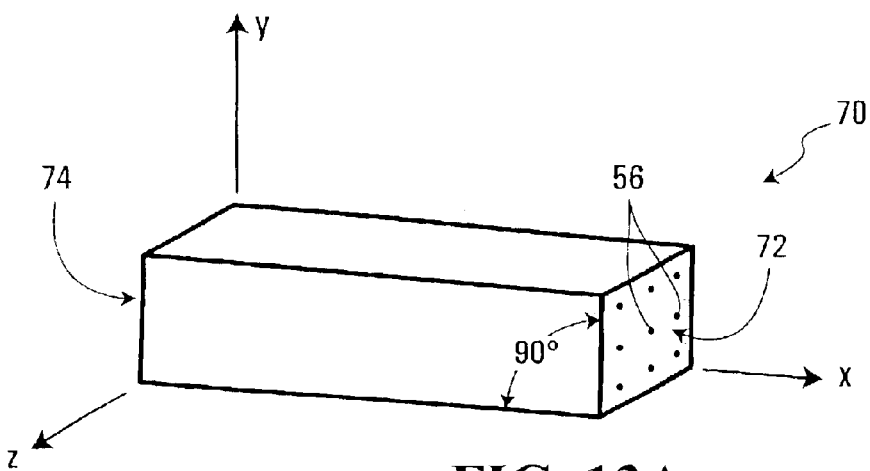
FIG. 13A is a perspective view of the connector shown in FIGS. 10A and 10B positioned in a Cartesian coordinate system with a terminal end formed into a plane normal to the x-y plane and x-z plane.
Figure 13B:
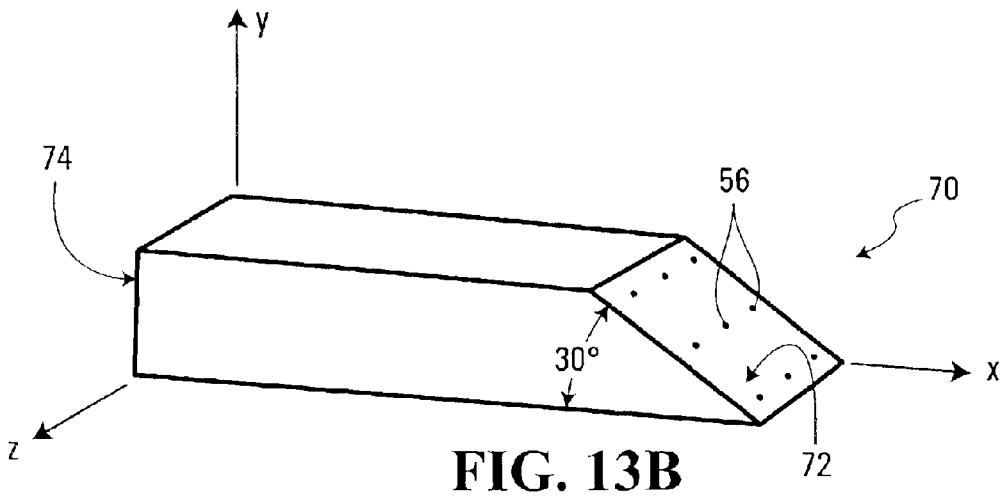
FIG. 13B is a perspective view of the connector shown in FIGS. 10A and 10B positioned in a Cartesian coordinate system with a terminal end formed into a plane normal to the x-y plane.
Figure 13C:
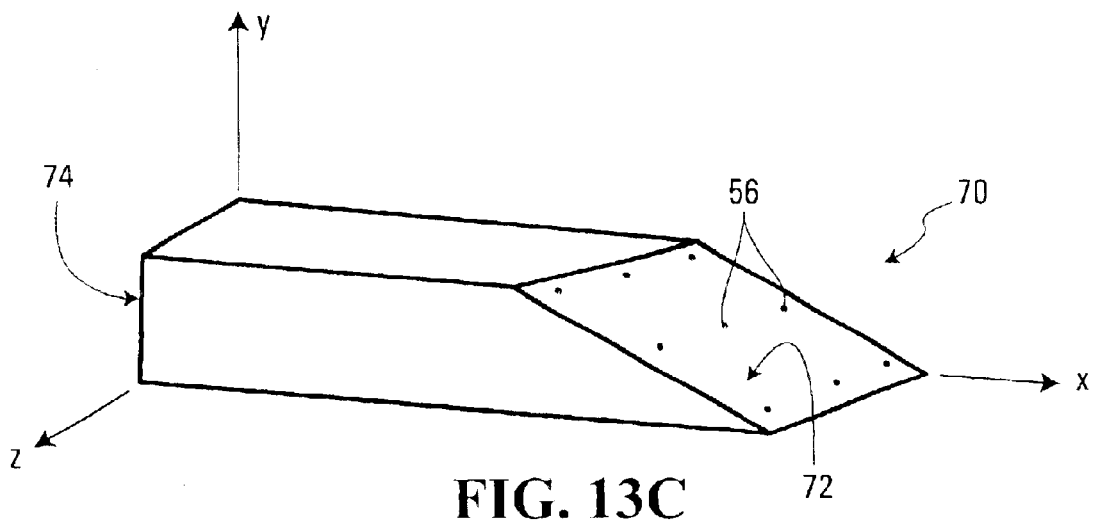
FIG. 13C is a perspective view of the connector shown in FIGS. 10A and 10B positioned in a Cartesian coordinate system with a terminal end formed into a plane that is not normal to any of the reference planes.

FIGS. 13A–C show some examples of connector 70, according to the third embodiment of the present invention positioned in relation to a Cartesian coordinate system with the surface of first terminal end 72 formed into three different configurations. In the examples shown, the x-axis is the reference axis, and is positioned along the direction of propagation of the signal transmissive pathways 56. It should be understood that any one of the connectors according to the four embodiments described above could have been depicted in FIGS. 13A–C.

As mentioned above it is possible to form the terminal ends of the connectors into three different types of configurations. The first type of configuration is shown in FIG. 13A, wherein the first terminal end 72 of connector 70 is formed into a plane that is normal to the direction of propagation of the signal transmissive pathways. With the surface of the first terminal end 72 formed into this plane, when the direction of propagation of signal transmissive pathways 56 is parallel to the x-axis, the plane of the first terminal end 72 is perpendicular to two reference planes, namely the x-z plane and the x-y plane. It should also be noted that the surface of the first terminal end 72 is also parallel to the y-z plane. With the first terminal end 72 in this configuration, the smallest possible separation exists between each signal transmissive pathway 56 as measured at the first terminal end 72.

An example of the second type of configuration is shown in FIG. 13B, wherein first terminal end 72 is formed into a plane such that when the direction of propagation of signal transmissive pathways 56 is parallel to the x-axis, connector 70 can be positioned such that the plane of first terminal end 72 is perpendicular to one reference plane in the coordinate system. In the example of FIG. 13B, connector 70 is positioned such that the plane of first terminal end 72 is perpendicular to the x-y plane. If connector 70 were rotated by 90 degrees, the plane of first terminal end 72 would be perpendicular to the x-z reference plane. As can be seen, with first terminal end 72 formed into the second type of configuration, the separation between some signal transmissive pathways 56 measured at the first terminal end 72 has expanded compared to the separation between the same signal transmissive pathways in the configuration shown in FIG. 13A. The expansion along imaginary line A is parallel to the surface of the first terminal end and also parallel to the x-y plane. This line is designated A in FIG. 14B.

An example of the third type of configuration is shown in FIG. 13C, wherein first terminal end 72 is formed into a plane such that when the direction of propagation of signal Transmissive pathways 56 is parallel to the x-axis, connector 70 can never be positioned such that the plane of first terminal end 72 is perpendicular to any of the x-y, x-z or y-z reference planes. As can be seen in FIG. 13C, with the first terminal end 72 formed into a plane of the third type, the separation between each signal transmissive pathway expands compared to the separation between the same signal transmissive pathways in the configurations shown in FIGS. 13A and 13B. The expansion occurs along two orthogonal imaginary lines B and C, that are parallel to the surface of the first terminal end 72 and that are non parallel to any one of the planes x-y, x-z and y-z.

In general, the more surface area on the plane of the terminal ends, the larger the separation will be between the signal transmissive pathways exposed at that terminal end.

The terminal ends of the connectors according to the above four embodiments of the present invention may be formed to connect to two surfaces that are prearranged into a desired non-parallel orientation. Alternatively, the connectors can be used to connect two surfaces that have different inter-contact-pad-spacing. However, this imposes the added constraint that the surfaces of the connector's terminal ends be formed so that the spacing between the signal transmissive pathways corresponds to the inter-contact-pad-spacing of the surfaces to be connected. As such, the orientation of the surfaces to be connected in relation to each other depends on the orientation of the surfaces of the connector's terminal ends.

Figure 14A:
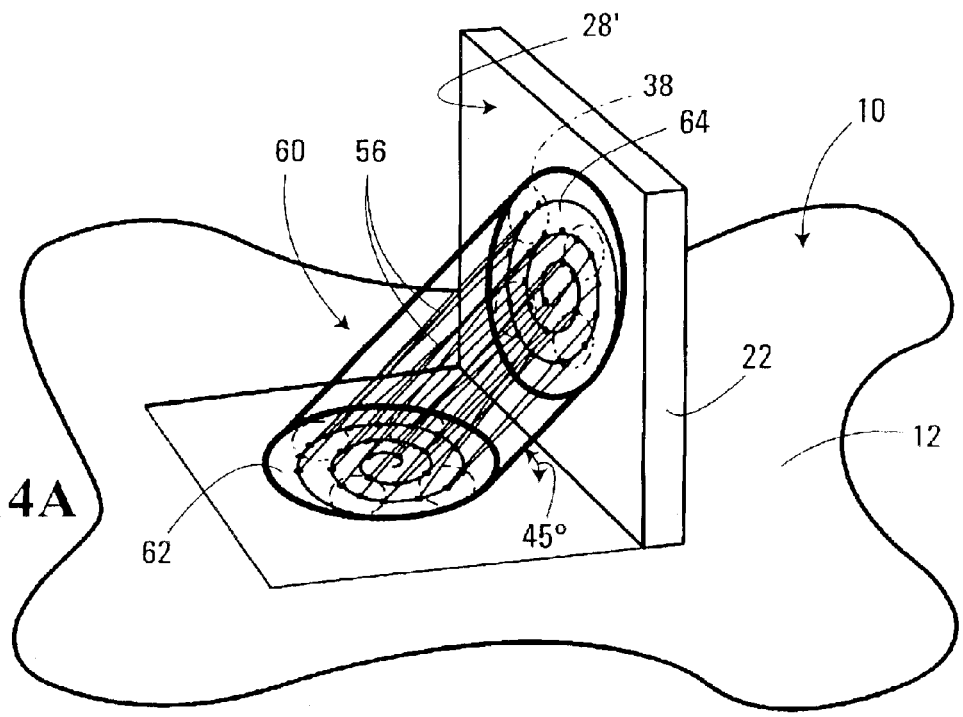
FIG. 14A is a perspective view of the connector shown in FIGS. 9A and 9B connecting a functional module to a body of semiconductor material.
Figure 14B:
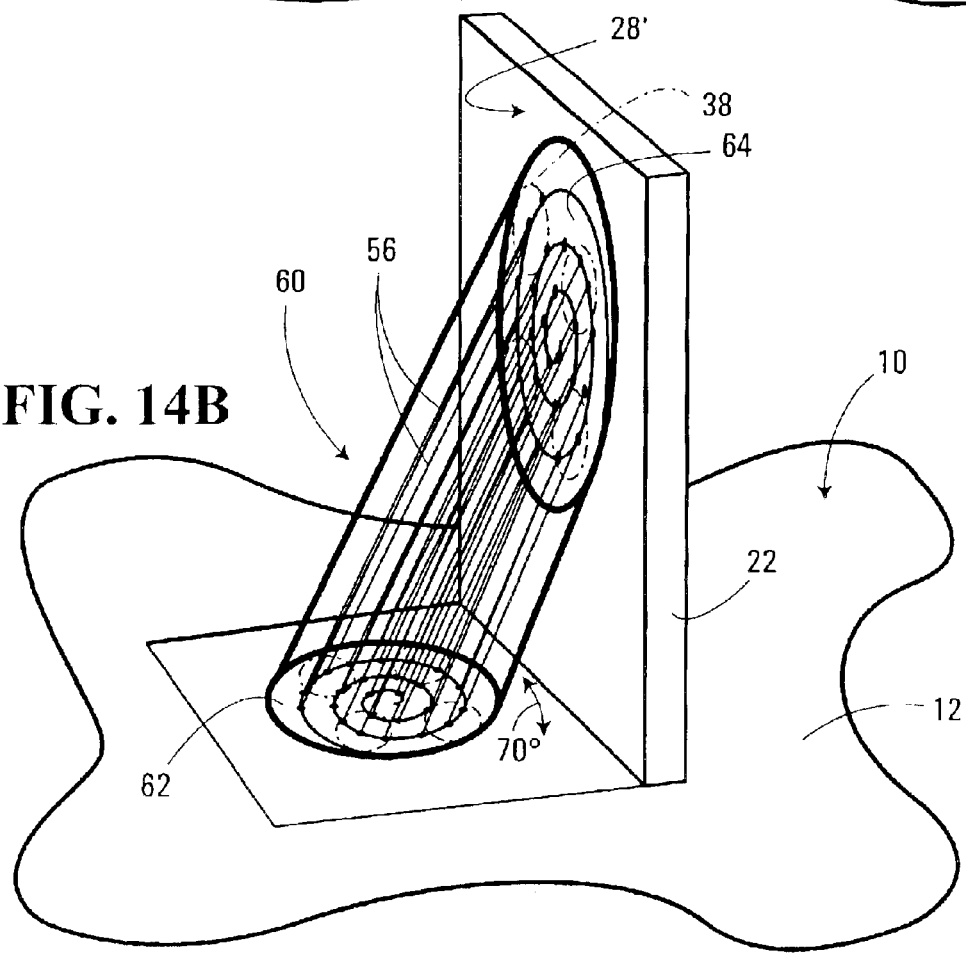
FIG. 14B is a perspective view of the connector shown in FIGS. 9A and 9B connecting a functional module to a body of semiconductor material.

FIG. 14A shows connector 60 according to the second embodiment of the present invention positioned at an angle of approximately 45 degrees with respect to the body 12 of wafer 10 (for clarity only a portion of wafer 10 is shown in FIGS. 14A and 14B). Therefore, both first terminal end 62, connected to the body 12 of wafer 10, and the second terminal end 64, connected to the main surface 28', of functional module 22 are formed at approximately 45 degrees with respect to the direction of propagation of the signal transmissive pathways 56. For clarity, connector 60 has been drawn transparent so that it can be seen that signal transmissive pathways 56 extend side by side from contact pads 38 on functional module 22 to the contact pads on wafer 10. Since both first terminal end 62 and second terminal end 64 are formed are the same angle with respect to the direction of propagation of signal transmissive pathways 56, the separation between signal transmissive pathways 56 will be the same at both first terminal end 62 and at second terminal end 64. It can also be seen that more than one signal transmissive pathway 56 contacts each contact pad on both functional module 22 and on the body 12 of wafer 10.

As can be seen in FIG. 14B, connector 60 is positioned at an angle of approximately 70 degrees with respect to wafer 10. Therefore, first terminal end 62, connected to the body 12 of wafer 10, has a much smaller surface area than second terminal end 64, connected to main surface 28' of functional module 22. This means that the distance between signal transmissive pathways 56 at the second terminal end 64 is much greater than the d stance between the same signal transmissive pathways 56 at the first terminal end 62. Such a configuration is desirable when the inter-contact-pad-spacing on functional module 22 is larger than inter-contact-pad-spacing on wafer 10. It can also be seen that more than one signal transmissive pathway 56 contacts each contact pad on both functional module 22 and on the body 12 of wafer 10.

Although FIGS. 14A and 14B show functional module 22 and wafer 10 positioned at an angle of 90 degrees with respect to each other, it is within the scope of the invention for connector 60, or any of the other connectors described above, to connect to the contact pads on two surfaces in any non-parallel configuration.

The present invention has been described in considerable detail with reference to certain preferred embodiments. However, it should be understood that variations and refinements of the present invention are possible without departing from the spirit of the invention. Therefore, the scope of the invention should be limited only by the appended claims and their equivalents.

What is claimed is:

1. A connector for transporting signals, said connector comprising:
   a continuous body, said continuous body having a three dimensional shape characterized by three reference axes, said continuous body being continuous along each one of the reference axes, said continuous body including:
   a) a first terminal end;
   b) a second terminal end remote from said first terminal end;
   a three-dimensional arrangement of signal transmissive pathways within said continuous body, said signal transmissive pathways including optical fibers, said signal transmissive pathways:
   a) being spaced from one another and extending along a direction of propagation from said first terminal end to said second terminal end;
   b) being exposed at said first terminal end and at said second terminal end to allow external devices connected at said first terminal end and at said second terminal ends, respectively to exchange signals via said signal transmissive pathways; and
   c) being distributed in said continuous body such that said signal transmissive pathways extend in multiple directions in a plane transverse to said direction of propagation.

2. A connector as defined in claim 1, wherein said signal transmissive pathways extend side by side along a direction of propagation from said first terminal end to said second terminal end.

3. A connector as defined in claim 2, wherein said signal transmissive pathways constitute a re-mapping layer.

4. A connector as defined in claim 3, wherein a distance defined between two of said signal transmissive pathways measured in a plane normal to the direction of propagation is constant from said first terminal end to said second terminal end.

5. A connector as defined in claim 3, wherein a distance defined between any pair of said signal transmissive pathways measured in a plane normal to the direction of propagation is constant from said first terminal end to said second terminal end.

6. A connector as defined in claim 3, wherein the first terminal end and the second terminal end define respective non-parallel surfaces.

7. A connector as defined in claim 6, wherein said arrangement of signal transmissive pathways includes a first signal transmissive pathway and a second signal transmissive pathway, a distance between said first signal transmissive pathway and said second signal transmissive pathway measured at said first terminal end and at said second terminal end respectively being different.

8. A connector as defined in claim 1, wherein said signal transmissive pathways include metallic conductors.

9. In combination:
   a first functional module having contact pads that enable said first functional module to communicate with external devices;
   a second functional module having contact pads that enable said second functional module to communicate with external devices, the contact pads of said first functional module positioned in a non-parallel relationship with respect to the contact pads of said second functional module;
   a connector for transporting signals between said first functional module and said second functional module, said connector comprising:
   a) a body having a plurality of superposed layers of material defining a three dimensional shape, said body including;
   i) a first terminal end; and
   ii) a second terminal end remote from said first terminal end;
   b) a three-dimensional arrangement of signal transmissive pathways within said body, said signal transmissive pathways including optical fibers, said signal transmissive pathways:
   i) being spaced from one another and extending along a direction of propagation from said first terminal end to said second terminal end;
   ii) being exposed at said first terminal end and at said second terminal end and connecting with the contact pads of said first discrete functional module and the contact pads of said second discrete functional module respectively; and
   iii) being distributed in said body such that said signal transmissive pathways extend in multiple directions in a plane transverse to said direction of propagation.

10. A connector for transporting signals, said connector comprising:
   a body having a plurality of superposed layers of material defining a three dimensional shape, said body including;
   a) a first terminal end;
   b) a second terminal end remote from said first terminal end;
   a three-dimensional arrangement of signal transmissive pathways within said body, said signal transmissive pathways including optical fibers, said signal transmissive pathways:
   a) being spaced from one another and extending along a direction of propagation from said first terminal end to said second terminal end;
   b) being exposed at said first terminal end and at said second terminal end to allow external devices connected at said first and at said second terminal ends respectively to exchange signals via said signal transmissive pathways; and
   c) being distributed in said body such that said signal transmissive pathways extend in multiple directions in a plane transverse to said direction of propagation.

11. A connector as defined in claim 10, wherein said signal transmissive pathways extend side by side along a direction of propagation from said first terminal end to said second terminal end.

12. A connector as defined in claim 11, wherein said signal transmissive pathways constitute a re-mapping layer.

13. A connector as defined in claim 12, wherein a distance defined between two of said signal transmissive pathways measured in a plane normal to the direction of propagation is constant from said first terminal end to said second terminal end.

14. A connector as defined in claim 12, wherein a distance defined between any pair of said signal transmissive pathways measured in a plane normal to the direction of propagation is constant from said first terminal end to said second terminal end.

15. A connector as defined in claim 12, wherein said first terminal end and said second terminal end define respective non-parallel surfaces.

16. A connector as defined in claim 15, wherein said arrangement of signal transmissive pathways includes a first signal transmissive pathway and a second signal transmissive pathway, a distance between said first signal transmissive pathway and said second signal transmissive pathway measured at said first and at said second terminal ends, respectively being different.

17. A connector as defined in claim 10, wherein said body includes a continuous sheet of material formed into a roll having a plurality of coils that form said layers.

18. A connector as defined in claim 10, wherein said body includes a sheet of material including a plurality of folds that form said layers.

19. A connector as defined in claim 10, wherein said body includes a plurality of superposed discrete layers.

20. A connector as defined in claim 10, wherein said signal transmissive pathways include metallic conductors.

21. A combination as defined in claim 9, wherein said signal transmissive pathways register with respective contact pads of said first functional modules and said second functional module.

* * * * *